US 6,665,826 B2

(12) United States Patent
Cowles

(10) Patent No.: US 6,665,826 B2
(45) Date of Patent: *Dec. 16, 2003

(54) METHOD AND APPARATUS FOR TESTING THE TIMING OF INTEGRATED CIRCUITS

(75) Inventor: Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/877,897

(22) Filed: Jun. 8, 2001

(65) Prior Publication Data

US 2001/0027549 A1 Oct. 4, 2001

Related U.S. Application Data

(63) Continuation of application No. 09/095,673, filed on Jun. 10, 1998, now Pat. No. 6,289,476.

(51) Int. Cl.[7] .................. G11C 29/00; G01R 31/28
(52) U.S. Cl. .............. 714/718; 714/724; 714/734; 324/158.1; 365/189.05; 365/201
(58) Field of Search ................. 714/718, 724, 714/733, 734, 736; 324/158.1; 365/200, 189.05, 184.09, 201

(56) References Cited

U.S. PATENT DOCUMENTS 5,933,434 A * 8/1999 Roohparvar ............... 714/718
5,938,783 A * 8/1999 Whetsel .................... 714/726

* cited by examiner

*Primary Examiner*—Emmanuel L. Moise
(74) *Attorney, Agent, or Firm*—Hugh R. Kress; Browning Bushman P.C.

(57) ABSTRACT

An integrated circuit includes a first external pin and an input buffer connected to the first external pin. The input buffer includes an output terminal and a first test mode input terminal adapted to disable the output terminal in response to a first test mode signal. A method for testing an integrated circuit, the integrated circuit including a first external pin and an input buffer, includes providing a first external input signal to the first external pin at a first specified time, and disabling the input buffer at a second specified time after the first specified time.

24 Claims, 6 Drawing Sheets

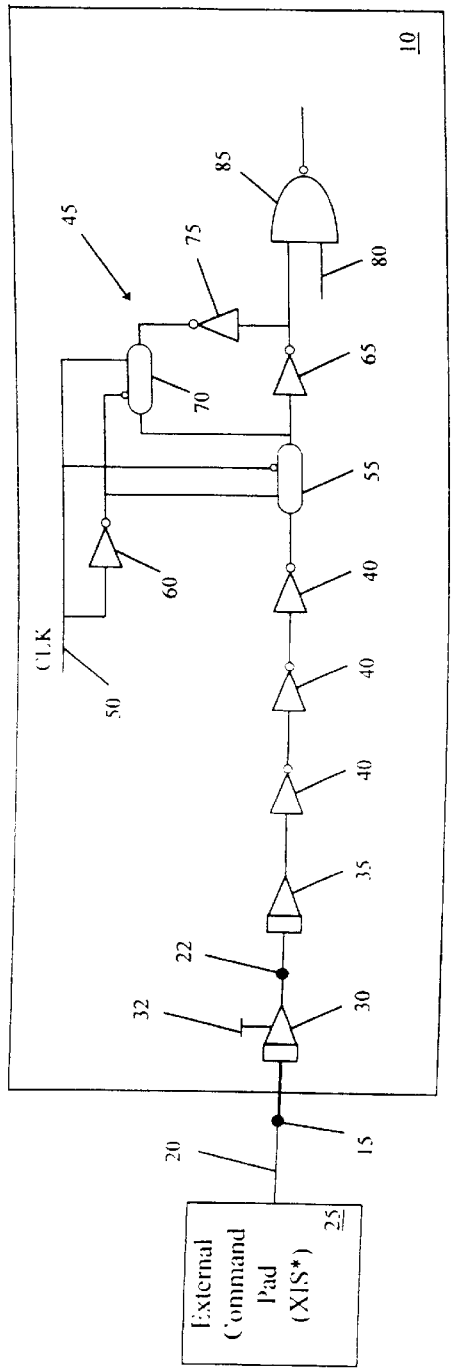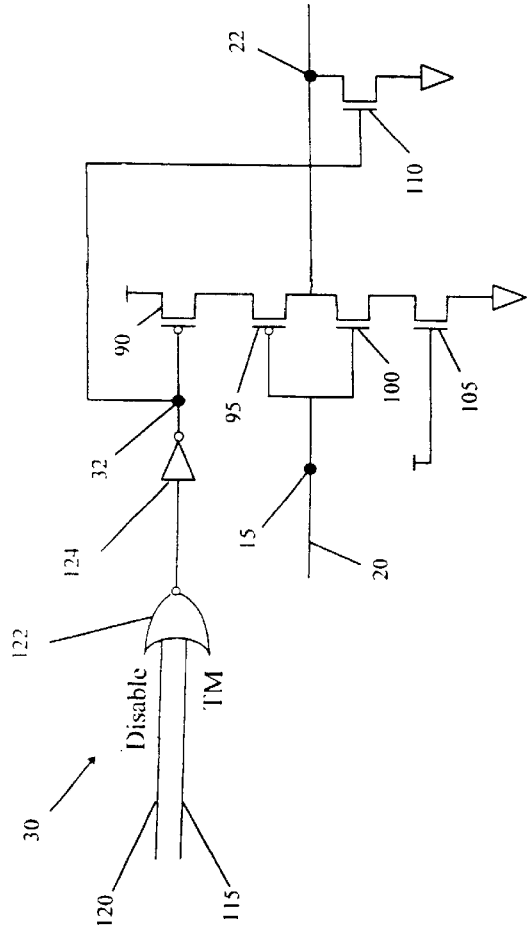

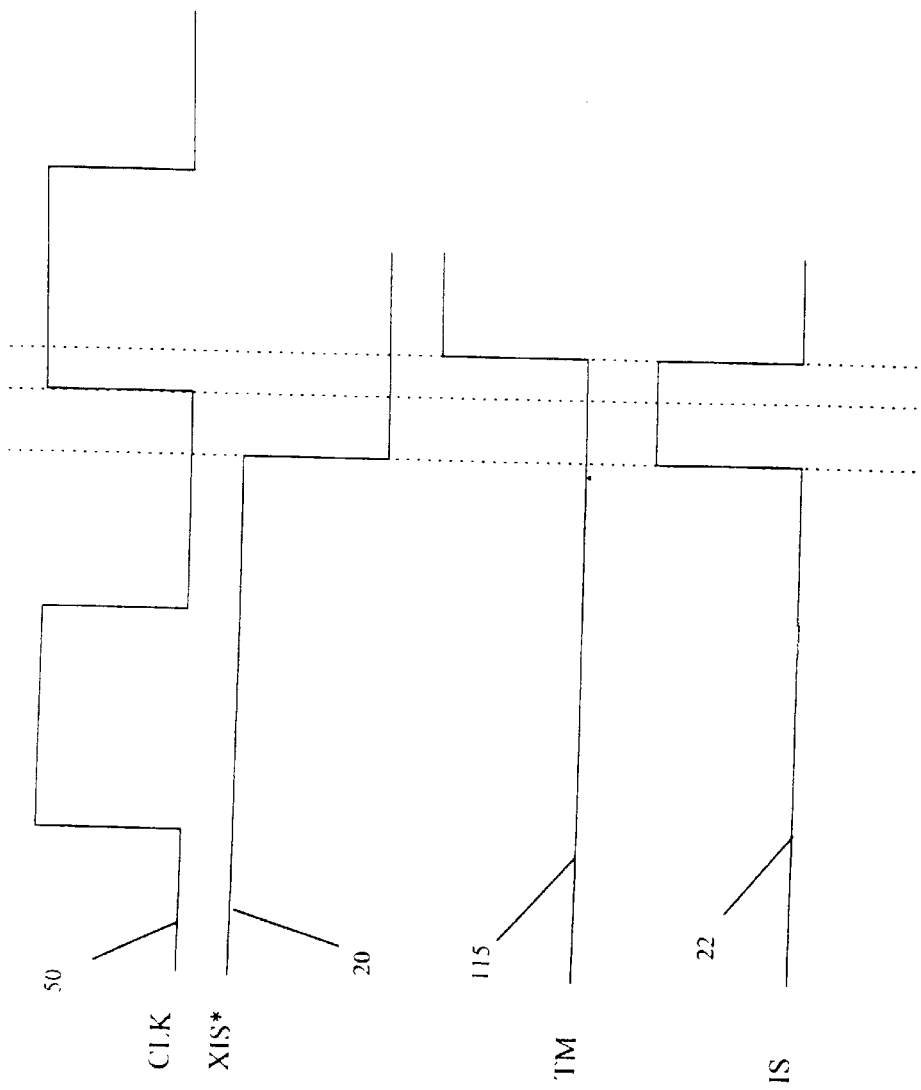

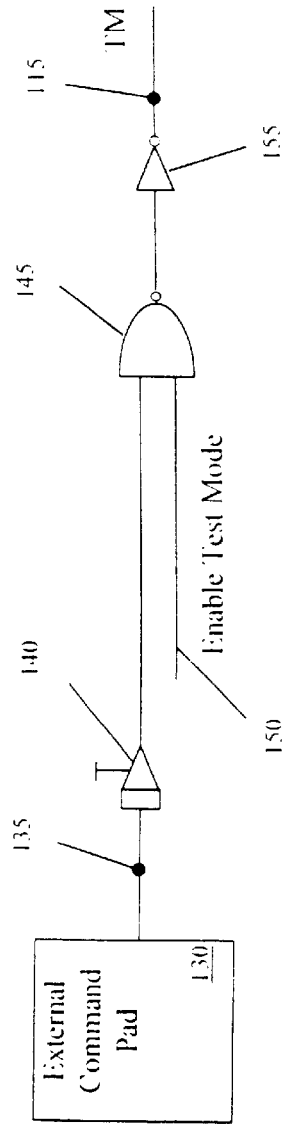

METHOD AND APPARATUS FOR TESTING THE TIMING OF INTEGRATED CIRCUITS

CROSS-REFERENCE TO RELATED APPLICATIONS

This is a continuation of prior application Ser. No. 09/095,673 filed on Jun. 10, 1998, now U.S. Pat. No. 6,289,476.

BACKGROUND OF THE INVENTION

1. Field of the Invention

The present invention relates generally to testing integrated circuits, and more particularly to verifying minimum setup and hold times on an integrated circuit.

2. Description of Related Art

In the fabrication of integrated circuits, such as semiconductor memory devices, it is common to test the integrated circuit to verify that certain timing parameters can be met by the circuit. In the case of a synchronous dynamic random access memory (SDRAM) commands and data signals are received synchronous with a clock signal. The signals are typically supplied to the external input pins of the SDRAM within certain timing specifications. For example, signals such as the row address select (RAS), column address select (CAS), external chip select (XCS), address lines, and data lines must be supplied to the input pins a specified time period before the rising clock edge (setup time), and must be held for a specified period of time after the rising clock edge (hold time).

To test an SDRAM to verify that it meets the timing requirements, an external tester is typically connected to the external pins of the SDRAM to supply a predetermined series of level signals and pulses that simulate various commands, operating modes, and data transactions in the memory device. The external pins of the SDRAM that provide output signals are monitored to evaluate proper functioning of the SDRAM.

As the clock speeds of integrated circuits, such as SDRAMs increase, the timing requirements become more stringent. The specification for a 125 MHz or faster SDRAM requires a setup time of 2 nanoseconds (ns) and a hold time of 1 ns. These requirements may become more stringent in the future as clock speeds increase. When testing an SDRAM, it is desirable to verify the setup and hold times for the device concurrently. In the case of the 125 MHz SDRAM, such concurrent testing would require that a 3 ns pulse be supplied as an input signal on a given command, address, or data line. However, current integrated circuit testers, such as a Terradyne 994, cannot supply a 3 nanosecond pulse. Lab results were gathered on a typical 100 MHz Terradyne 994 integrated circuit tester attempting to supply a 3 ns asserted low pulse at various voltage supply levels ($V_{IH}$). At $V_{IH}$ equal to 3V, the tester provides a 2.7 ns (midpoint to midpoint) pulse that only reaches about 0.3V at its negative peak. At $V_{IH}$ equal to 4V, the tester provides a 2.6 ns pulse that only reaches about 0.3V at its negative peak. At $V_{IH}$ equal to 5V, the tester provides a 2.2 ns pulse that only reaches about 1.2V at its negative peak. These pulses do not have sufficient pulse width or voltage drop to effectively simulate the required timing. As a result of the inability of the tester to provide a sufficient pulse, the setup and hold times must be tested separately. This condition is undesirable because it increases testing time and expense and also does not test worst case conditions on every clock pulse. As a result, not all potential timing problems are readily observable.

It would be desirable to test timing specifications, such as setup and hold times, in integrated circuits under worst case conditions.

SUMMARY OF THE INVENTION

An aspect of the invention is seen in an integrated circuit including a first external pin and an input buffer connected to the first external pin. The input buffer includes an output terminal and a first test mode input terminal adapted to disable the output terminal in response to a first test mode signal.

Another aspect of the invention is seen in a method for testing an integrated circuit. The integrated circuit includes a first external pin and an input buffer. The method includes providing a first external input signal to the first external pin at a first specified time and disabling the input buffer at a second specified time after the first specified time.

BRIEF DESCRIPTION OF THE DRAWINGS

FIG. 1 illustrates a circuit diagram for testing timing specifications of an integrated circuit;

FIG. 2 illustrates a circuit diagram of an input buffer used in the circuit of FIG. 1;

FIG. 3 illustrates a timing diagram of the input and output signals of the circuit of FIG. 1;

FIG. 4A illustrates a circuit diagram in which the test mode signal used in FIG. 2 is generated from an external source;

FIG. 4B illustrates a circuit diagram in which the test mode signal used in FIG. 2 is generated from an internal self-timed source;

Figure 5:
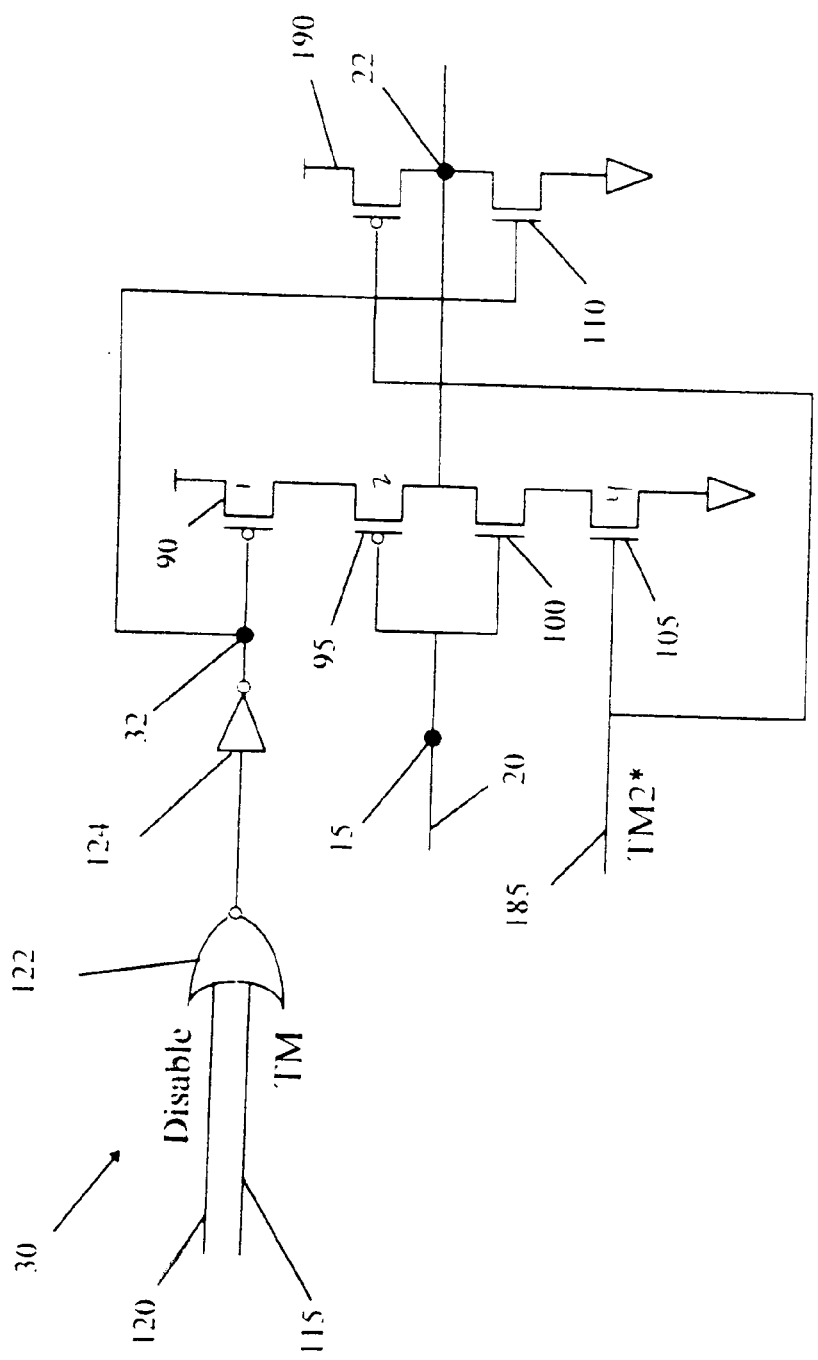
FIG. 5 illustrates a circuit diagram of an alternative input buffer used in the circuit of FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DESCRIPTION OF ILLUSTRATIVE EMBODIMENTS

The following examples are included to demonstrate preferred embodiments of the invention. It should be appreciated by those skilled in the art that the techniques disclosed in the examples that follow represent techniques discovered by the inventor to function well in the practice of the invention. However, those skilled in the art should, in light of the present disclosure, appreciate that many changes can be made in the specific embodiments disclosed herein without departing from the spirit and scope of the invention.

The specification hereinafter will be directed to testing the setup and hold time specifications of a memory device. However, the invention described herein may be applied to verifying any timing specification. In the illustrative example, the setup and hold times for the external chip select signal of an SDRAM are tested. This example is provided for illustrative purposes and is not to be regarded as limiting the application of the invention.

Referring to FIG. 1, an integrated circuit 10 having an external input pin 15 is shown. The external input pin 15 receives an asserted low external input signal (XIS*) 20 over a line connected to an external pad 25, such as may be provided by an external integrated circuit tester (e.g., Terradyne 994). An example of an asserted low input signal would be an external chip select signal (XCS). The XIS* signal 20 is received by an input buffer 30. An input buffer 30 typically includes a disable input 32 that is controlled in response to internal or external signals to selectively enable or disable the input buffer 30. During times when the integrated circuit is inactive, for example when neither CAS nor RAS is asserted, the input buffer 30 may be disabled to prevent unnecessary power dissipation in the integrated circuit 10.

When the disable signal is asserted, the output of the input buffer 30 is typically pulled to either a logically high or a logically low state. For purposes of this illustration an input buffer 30 having a low output state when disabled is described. The individual circuit elements of the input buffer 30 are described in greater detail below in reference to FIG. 2.

In FIG. 1, the XIS* signal 20 is inverted by the input buffer 30 to provide an input signal (IS) 22. The input buffer 30 is connected to a delay element 35. The delay element 35 is connected to a series of scaling buffers 40, which increase the power level of the signal to ensure sufficient magnitude for transmitting to the remainder of the integrated circuit 10.

The scaling buffers 40 are connected to a latch 45 that receives a clock (CLK) signal 50 and latches the value of the IS signal 22 when the CLK signal 50 transitions from a logically low state to a logically high state. A multiplexer 55 receives the CLK signal 50 and an inverted clock signal from an inverter 60. The multiplexer 55 is enabled when the CLK signal 50 is in a logically low state, thus passing the IS signal 22 to inverter 65. The output of the inverter 65 is connected to the input of a multiplexer 70 through an inverter 75. The multiplexer 70 receives the CLK signal 50 and the inverted CLK signal from inverter 60, and is enabled when the CLK signal 50 is in a logically high state. When the CLK signal 50 transitions to a logically high state (i.e., signifying a positive edge), the multiplexer 55 is disabled, and the multiplexer 70 is enabled, thus latching the value of the IS signal 22 coincident with the positive edge of the CLK signal 50. The output of the multiplexer 70 is connected to the input of the inverter 65. The IS signal 22 is held by the multiplexer 70 until the CLK signal 50 transitions to a logically low state.

The latched output of the multiplexer 70 may be combined with another latched command 80 (e.g., CAS and RAS low) in a logic gate 85 to issue a command to the integrated circuit 10.

The setup and hold time timing specifications for the integrated circuit 10 ensure that the IS signal 22 is present at the input of the multiplexer 70 before the positive clock edge and is held at the input of the multiplexer 70 for a sufficient time after the positive edge to ensure that the proper value is latched for the current clock cycle. If the value of the IS signal 22 is not stable during the period immediately before and after the positive clock edge, it may not be latched properly by the multiplexer 70, and the integrated circuit 10 may not function as intended.

A detailed circuit diagram of the input buffer 30 is shown in FIG. 2. The input buffer 30 includes p-channel transistors 90, 95 and n-channel transistors 100, 105, 110. The gate inputs of the p-channel transistor 95 and the n-channel transistor 100 are connected to the external input pin 15. The gate input of the n-channel transistor 105 is tied to a logically high voltage level. When the XIS* signal 20 is in a logically high state, the p-channel transistor 95 is disabled and the n-channel transistors 100, 105 are enabled, thus tying the IS signal 22 to a logically low state. When the XIS* signal 20 is in a logically low state, the n-channel transistor 100 is disabled, and the p-channel transistor 95 is enabled. If the gate input of the p-channel transistor 90 is in a logically low state, the IS signal 22 will thus be tied to a logically high voltage level.

The gate inputs of the p-channel transistor 90 and the n-channel transistor 110 enable or disable the input buffer 30. When the input buffer 30 is disabled, the p-channel transistor 90 will be disabled, thus isolating the IS signal 22 from a voltage source, Vcc, and the n-channel transistor 110 will be enabled, thus tying the IS signal 22 to a logically low voltage level. When the input buffer 30 is enabled, the p-channel transistor 90 will be enabled and the n-channel transistor 110 will be disabled, thus allowing the value of the IS signal 22 to depend on the value of the XIS* signal 20 as described above.

By selectively disabling the input buffer 30, a pulse can be simulated without the limitations discussed above concerning the ability of an external tester to provide a narrow pulse, such as a 3 ns pulse. To test the setup and hold times for the XIS* signal 20, the integrated circuit 10 is first placed in a test mode of operation. In an SDRAM, for example, the device may be placed in test mode by issuing a load special register command with the logic levels of specified address pins during the load special register command controlling the particular test mode being entered. A test mode (TM) signal 115 is used to control the enable input 32 of the input buffer 30.

The XIS* signal 20 illustrated in FIGS. 1 and 2 is an asserted low signal, so a logically high to logically low pulse is simulated to test the setup and hold times. The testing parameters are controlled such that a conflict does not occur between the TM signal 115 and a normal disable signal 120 used to disable the input buffer 30 to conserve power. The normal disable signal 120 disables the input buffer 30 during normal use, i.e. non-test mode. Whenever the test mode is active, the disable signal is at ground. The TM signal 115 and the disable signal 120 provide the inputs to a NOR gate 122. The output of the NOR gate 122 is connected to an inverter 124. The output of the inverter 124 is the disable input 32 of the input buffer 30.

The timing relationships between the CLK signal 50, the XIS* signal 20, the TM signal 115, and the IS signal 22 are shown in FIG. 3. For ease of illustration, ideal timing diagrams are shown. Propagation delays and transition times are not shown. It is within the capabilities of one of ordinary skill in the art to coordinate the delay elements throughout the various circuits described herein to ensure that the signals propagate as desired.

The XIS* signal 20 may be provided by an external tester (not shown) and the TM signal 115 may be controlled by an external tester or may be generated as a timed signal from a different signal, as described in greater detail below in reference to FIGS. 4A and 4B.

To initiate a positive pulse in the IS signal 22, the XIS* signal 20 transitions from a logically high state to a logically low state 2 ns before the positive edge of the CLK signal 50 to establish the required setup time. Because the TM signal 115 is at a logically low state, the input buffer 30 is not disabled, and the value of the XIS* signal 20 will be inverted. The IS signal 22 will transition from a logically low to a logically high state. The TM signal 115 transitions from a logically low state to a logically high state 1 ns after the positive edge of the CLK signal 50 to establish the required hold time. When the TM signal 115 transitions to a logically high state, the input buffer 30 is disabled to a logically low state by the n-channel transistor 110, thus tying the IS signal 22 to a logically low state as described above. The level of the XIS* signal 20 after the TM signal 115 has been asserted does not impact the operation of the input buffer 30, because the input buffer 30 is disabled. Thus, the XIS* signal 20 may be transitioned at any time after the assertion of the TM signal 115 to prepare for the next test.

The coordinated transitions of the XIS* signal 20 and the TM signal 115 result in an IS signal 22 having a 3 ns pulse. Accordingly, the setup and hold times for the XIS* signal are tested concurrently.

FIG. 4A shows a circuit diagram wherein the TM signal 115 is generated from an external input signal. The specific pin used to supply the TM signal 115 depends on the pin or pins being tested and the specific test being conducted. For example, unused address pins, or other pins not used during the command being tested (i.e., don't care state) may be used to supply the TM signal 115 to the input buffer 30. The connections between various pins of the integrated circuit 10 and the various input buffers 30 would be planned during the design of the integrated circuit 10 in light of the desired tests to be conducted.

An external pad 130 is connected to an input pin 135 of the integrated circuit 10. The input pin 135 is connected to an input buffer 140, which is in turn connected to an input of a NAND gate 145. The NAND gate 145 also receives an enable test mode signal 150. The enable test mode signal 150 indicates that the test mode has been enabled for the integrated circuit 10 as described above. The output of the NAND gate 145 is connected to an inverter 155. The output of the inverter 155 provides the TM signal 115 to the input buffer 30. When the enable test mode signal 150 is high (i.e., in test mode), an input signal provided at the external pad 130 is provided as the TM signal 115. When the enable test mode signal is in a logically low state (i.e., not in test mode), the TM signal 115 is held in a logically low state by the NAND gate 145 and the inverter 155.

FIG. 4B shows an alternative embodiment of a circuit for generating the TM signal 115. In FIG. 4B, the TM signal 115 is generated as a timed offset from an external clock signal 160. The external clock signal 160 is supplied to an input buffer 165. The output of the input buffer 165 is connected to a delay element 170. Similar to the embodiment shown in FIG. 4A, the delay element is connected to a NAND gate 175 that receives the enable test mode signal 150. The output of the NAND gate 175 is connected to an inverter 180. The output of the inverter 180 represents the TM signal 115. To reproduce the timing diagram of FIG. 3, the delay element 170 introduces a delay of 1 ns between the TM signal 115 and the CLK signal 50.

An alternative embodiment of the circuit of FIG. 2 is shown in FIG. 5. The is circuit of FIG. 5 can be configured to disable the input buffer 30 in a logically high state or a logically low state depending on the desired condition. A second test mode (TM2*) signal 185 is connected to the gate input of n-channel transistor 105 for disabling the path to ground when the TM2* signal 185 is in a logically low state. The TM2* signal 185 is also connected to the gate input of a p-channel transistor 190 for tying the IS signal 22 to a logically high voltage level when the TM2* signal 185 is in a logically low state. The TM signal 115 and the TM2* signal 185 may be supplied externally from separate external pads 130 similar to FIG. 4A, or from a self-timed signal similar to FIG. 4B.

Figure 6:
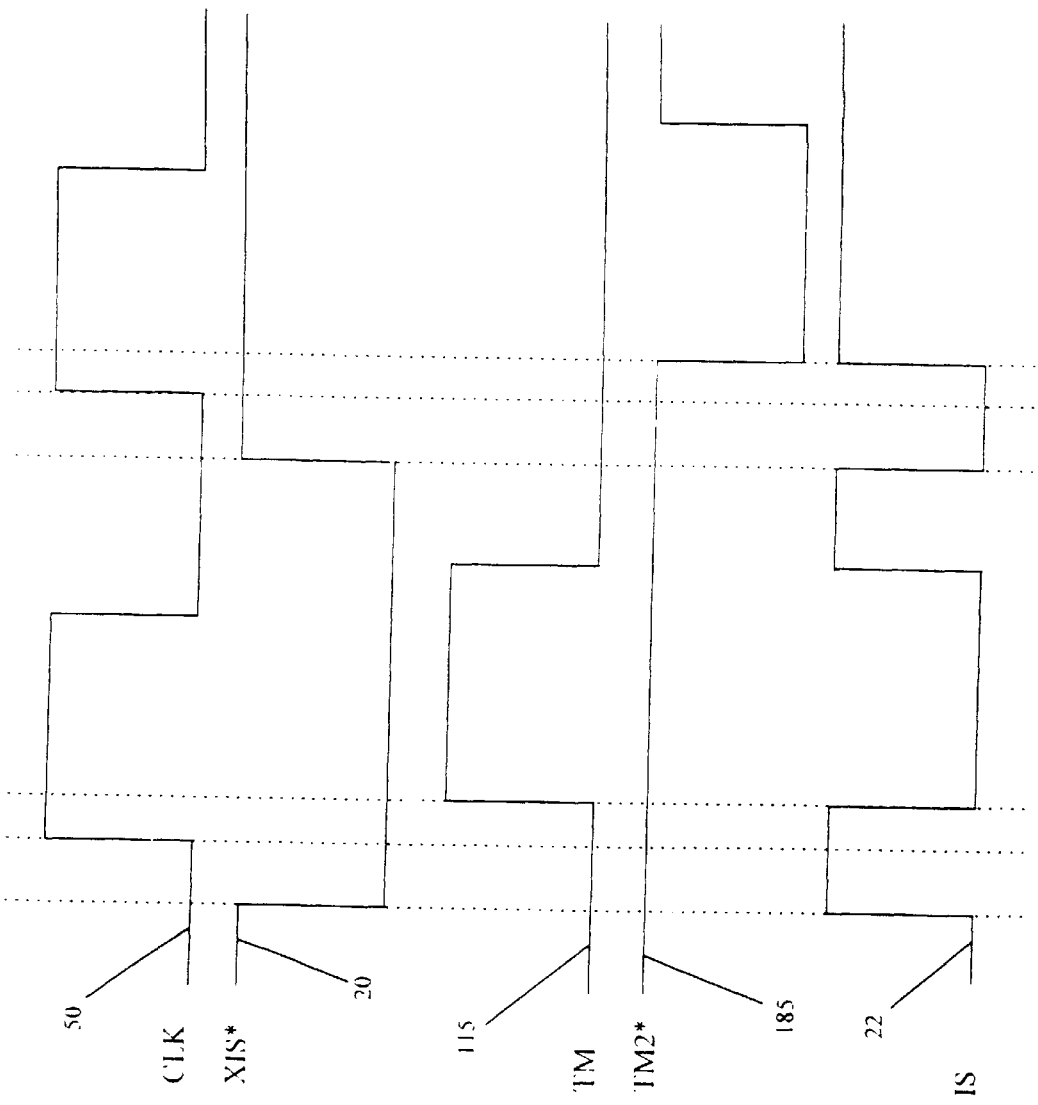
FIG. 6 illustrates a timing diagram of the input and output signals of the circuit of FIG. 5.

FIG. 6 shows the timing relationships between the CLK signal 50, the XIS* signal 20, the TM signal 115, the TM2* signal 185, and the IS signal 22 for simulating asserted high pulses and asserted low pulses. Again, for ease of illustration, ideal timing diagrams are shown. Propagation delays and transition times are not shown. It is within the capabilities of one of ordinary skill in the art to coordinate the delay elements throughout the various circuits described herein to ensure that the signals propagate as desired.

The level of the XIS* signal 20 after the TM signal 115 or the TM2* signal 185 have been asserted does not impact the operation of the input buffer 30. Thus, the XIS* signal 20 may be transitioned at any time after the assertion of the TM signal 115 or the TM2* signal 185 to prepare for the next test. Again, the XIS* signal 20 may be provided by an external tester (not shown) and the TM signal 115 and TM2* signal 185 may be controlled by an external tester or may be generated as a timed signal from a different signal, as described above in reference to FIGS. 4A and 4B.

To produce a positive pulse in the IS signal 22, the XIS* signal 20 transitions from a logically high state to a logically low state 2 ns before the positive edge of the CLK signal 50 to establish the required setup time. Because the TM signal 115 is at a logically low state, the input buffer 30 is not disabled, and the value of the XIS* signal 20 will be inverted. The IS signal 22 will transition from a logically low to a logically high state. The TM signal 115 transitions from a logically low state to a logically high state 1 ns after the positive edge of the CLK signal 50 to establish the required hold time. When the TM signal 115 transitions to a logically high state, the input buffer 30 is disabled to a logically low state by the n-channel transistor 110, thus tying the IS signal 22 to a logically low state as described above. The level of the XIS* signal 20 after the TM signal 115 has been asserted does not impact the operation of the input buffer 30. Thus, the XIS* signal 20 may be transitioned at any time after the assertion of the TM signal 115 to prepare for the next test.

In FIG. 6, the XIS* signal 20 was left at a logically low state after the assertion of the TM signal 115 to provide the initial state for the subsequent pulse created by the assertion of the TM2* signal 185.

To produce a negative pulse in the IS signal 22, the XIS* signal 20 transitions from a logically low state to a logically high state 2 ns before the positive edge of the CLK signal 50 to establish the required setup time. Because the TM2* signal 185 is at a logically high state, the input buffer 30 is not disabled, and the value of the XIS* signal 20 will be inverted. The IS signal 22 will transition from a logically high to a logically low state. The TM2* signal 185 transitions from a logically high state to a logically low state 1 ns after the positive edge of the CLK signal 50 to establish the required hold time. When the TM2* signal 185 transitions to a logically low state, the input buffer 30 is disabled to a logically high state by the n-channel transistor 190, thus tying the IS signal 22 to a logically high state as described above. The level of the XIS* signal 20 after the TM2* signal 185 has been asserted does not impact the operation of the input buffer 30. Thus, the XIS* signal 20 may be transitioned at any time after the assertion of the TM2* signal 185 to prepare for the next test.

The coordinated transitions of the XIS* signal 20, the TM signal 115, and the TM2* signal 185 result in an IS signal 22 having either a 3 ns positive or negative pulse. Accordingly, the setup and hold times for the XIS* signal are tested concurrently.

Figure 7:
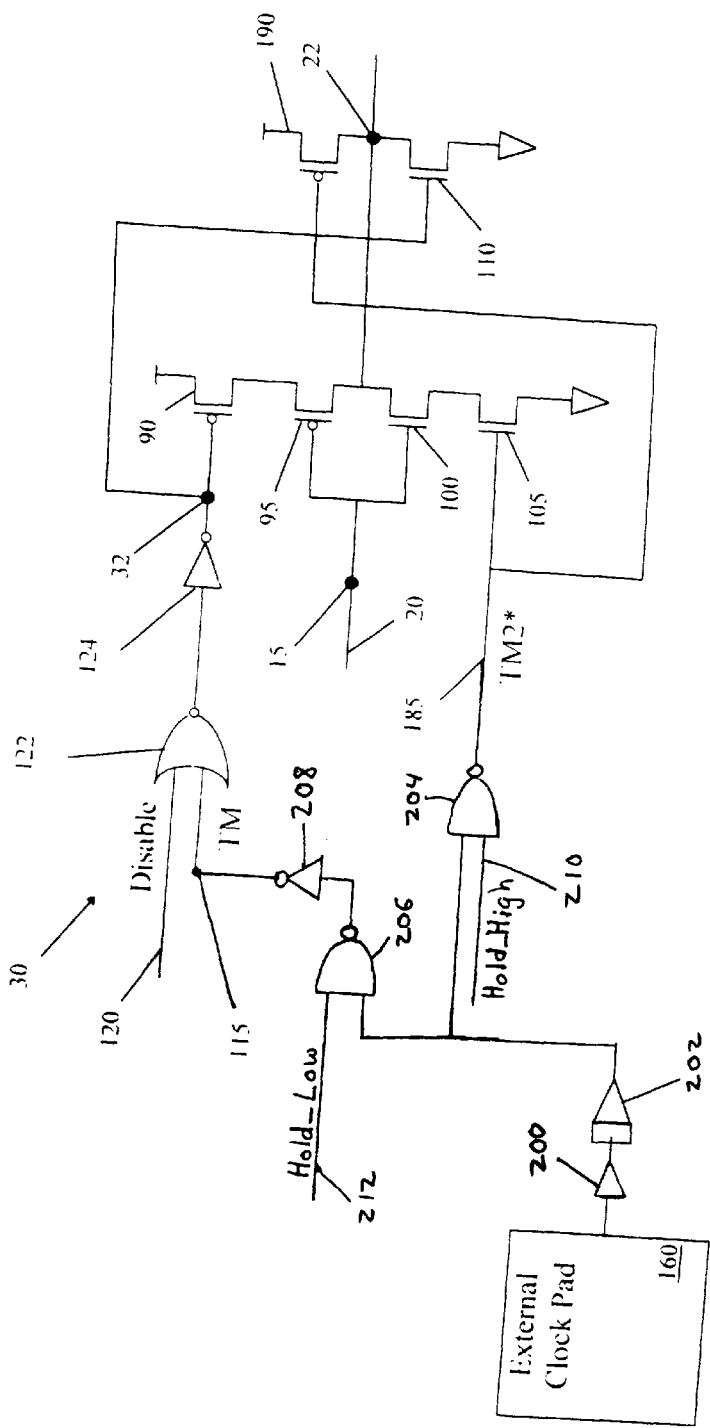
FIG. 7 shows an alternate embodiment that internally produces the delayed TM and TM2* signals of FIG. 6 from the CLK signal.

FIG. 7 shows an alternate embodiment that internally produces the delayed TM and TM2* signals 115, 185 of FIG. 6 from the CLK signal 50. An input buffer 200 increases the output power level of the external clock pad 160 before sending the CLK signal 50 to a delay element 202. The delay element 202 introduces a delay with respect to the CLK signal 50, e.g., the 1 ns delay of FIG. 6, and sends the delayed signal to first and second NAND gates 204, 206. The output signal of the first NAND gate 204 produces the TM2* signal 185. The output signal of the second NAND gate 206 produces the TM signal 115 after being inverted by the inverter 208. The embodiment of FIG. 7 produces the TM2* signal 185 and the TM signal 115, properly delayed with respect to the CLK signal 50 of FIG. 6, in response to activation by logically high $Hold_{13}$ High and $Hold_{13}$ Low signals 210, 212, respectively.

While the invention is susceptible to various modifications and alternative forms, specific embodiments have been shown by way of example in the drawings and have been described in detail herein. However, it should be understood that the invention is not intended to be limited to the particular forms disclosed. It will be appreciated by those of ordinary skill having the benefit of this disclosure that numerous variations from the foregoing illustrations will be possible without departing from the inventive concept described herein. Accordingly, it is the claims set forth below, and not merely the foregoing illustration, which are intended to define the exclusive rights claimed in this application.

What is claimed is:

1. An integrated circuit, comprising:
   a first external pin; and
   an input buffer connected to said first external pin, wherein said input buffer includes an output terminal and a first test mode input terminal, said input buffer responsive to assertion of a first test mode signal on said first external pin to disable said output terminal;
   wherein said first test mode signal is asserted in a predetermined timed relationship with assertion of an external input signal on said first external pin.

2. The integrated circuit of claim 1, said input buffer further comprising:
   a disable input terminal, wherein said integrated circuit is responsive to a disable signal to disable said input buffer.

3. The integrated circuit of claim 1, wherein said input buffer provides a logic low output at said output terminal when said input buffer is disabled.

4. The integrated circuit of claim 1, wherein said input buffer provides a logic high output at said output terminal when said input buffer is disabled.

5. The integrated circuit of claim 1, further comprising:
   a second external pin connected to said first test mode input terminal to receive said first test mode signal.

6. The integrated circuit of claim 1, further comprising:
   a second external pin adapted to receive an external input signal;
   a delay element connected to said second external pin and to said first test mode input terminal, said delay element responsive to said external input signal applied to said second external pin to produce a delayed input signal.

7. The integrated circuit of claim 6, wherein said external input signal applied to said second external pin comprises an external clock signal.

8. The integrated circuit of claim 1, wherein said input buffer includes:
   a first transistor connected to a voltage source, a gate input of said first transistor being connected to said first test mode input terminal;
   a second transistor connected to said first transistor and to said output terminal, a gate input of said second transistor being connected to the input terminal;
   a third transistor connected to said output terminal and to ground, a gate input of said third transistor being connected to said input terminal; and
   a fourth transistor connected between said output terminal and ground, a gate input of said fourth transistor being connected to a second test mode input terminal.

9. The integrated circuit of claim 8, further comprising a fifth transistor connected to said voltage source and to said output terminal, said fifth transistor coupling said output terminal to said voltage source in response to said test mode signal.

10. The integrated circuit of claim 9, further comprising a sixth transistor connected to ground and to said output terminal, said sixth transistor coupling said output terminal to ground in response to said first test mode signal.

11. The integrated circuit of claim 9, wherein the first transistor isolates said second transistor from said voltage source in response to said first test mode signal.

12. The integrated circuit of claim 9, wherein said first and second transistors comprise p-channel transistors and said third and fourth transistors comprise n-channel transistors.

13. The integrated circuit of claim 12, wherein said fifth transistor is an n-channel transistor and said sixth transistor is a p-channel transistor.

14. The integrated circuit of claim 1, wherein said input buffer includes:
   a first transistor connected to ground, a gate input of said first transistor being connected to a second test mode input terminal;
   a second transistor connected to said first transistor and said output terminal, a gate input of said second transistor being connected to said input terminal;
   a third transistor connected to said output terminal, the gate input of said third transistor being connected to said input terminal; and
   a fourth transistor connected to said third transistor and to a voltage source, a gate input of said fourth transistor being connected to said first test mode input terminal.

15. The integrated circuit of claim 14, further comprising a fifth transistor, coupled between said voltage source and said output terminal, said fifth transistor coupling said output terminal to said voltage source in response to said second test mode signal.

16. The integrated circuit of claim 15, further comprising a sixth transistor, coupled between ground and said output terminal said sixth transistor coupling said output terminal to ground in response to said first test mode signal.

17. The integrated circuit of claim 14, wherein said first transistor isolates the second transistor from ground in response to the second test mode signal.

18. The integrated circuit of claim 14, wherein said first and second transistors comprise n-channel transistors and said third and fourth transistors comprise p-channel transistors.

19. The integrated circuit of claim 1, wherein said input buffer is responsive to said first test mode signal applied to said first test mode input terminal to drive said output terminal to a first logic state.

20. The integrated circuit of claim 19, further comprising a second test mode input terminal, wherein said data buffer is responsive to a second test mode signal to drive the output terminal to a second logic state different than said first logic state.

21. The integrated circuit of claim 20, further comprising:
a second external pin connected to the second test mode input terminal and adapted to receive the second test mode signal.

22. The integrated circuit of claim 20, further comprising;
a second external pin for receiving an external input signal; and
a delay element connected to the second external pin for providing a delayed input signal;
wherein said delay element is connected to said second test mode input terminal.

23. An integrated circuit, comprising:
a first external pin; and
an input buffer connected to said first external pin, wherein said input buffer includes an output terminal and first and second test mode input terminals, said first and second test mode input terminals respectively responsive to first and second test mode signals to disable said output terminal;
a second external pin adapted to receive an external clock signal; and
a delay element connected to said second external pin for producing a delayed clock signal, said delay element being coupled to said second test mode input terminal;
a first transistor connected to a voltage source, a gate input of said first transistor being connected to the first test mode input terminal;
a second transistor connected to the first transistor and the output terminal, a gate input of said second transistor being connected to the input terminal;
a third transistor connected to said output terminal, a gate input of said third transistor being connected to said input terminal; and
a fourth transistor connected between said third output terminal and ground, a gate input of said fourth transistor being connected to said second test mode input terminal and
a fifth transistor coupled between said output terminal and a voltage source, said fifth transistor coupling said output terminal to said voltage source in response to said second test mode signal.

24. The integrated circuit of claim 23, further comprising a sixth transistor coupled between said output terminal and ground, said sixth transistor coupling said output terminal to ground in response to said first test mode signal.

* * * * *